United States Patent
Raz et al.

(10) Patent No.: US 12,333,231 B1
(45) Date of Patent: Jun. 17, 2025

(54) RECONFIGURABLE INTEGRATED CIRCUIT (IC) DEVICE AND A SYSTEM AND METHOD OF CONFIGURING THEREOF

(71) Applicant: NEXT SILICON LTD., Givatayim (IL)

(72) Inventors: Elad Raz, Ramat Gan (IL); Ilan Tayati, Tzur Hadassa (IL); Ronen Gal, Ramat Gan (IL); Oded Margalit, Ramat Gan (IL); Elad Shliselberg, Ramat Gan (IL)

(73) Assignee: NEXT SILICON LTD., Givatayim (IL)

( * ) Notice: Subject to any disclaimer, the term of this patent is extended or adjusted under 35 U.S.C. 154(b) by 0 days.

(21) Appl. No.: 18/935,622

(22) Filed: Nov. 3, 2024

(51) Int. Cl.
   G06F 30/34 (2020.01)
   G06F 9/30 (2018.01)

(52) U.S. Cl.
   CPC .......... *G06F 30/34* (2020.01); *G06F 9/30101* (2013.01)

(58) Field of Classification Search
   USPC .................................................... 716/117
   See application file for complete search history.

(56) References Cited

U.S. PATENT DOCUMENTS

| | | | |
|---|---|---|---|
| 11,720,496 B2 | 8/2023 | Raz | |
| 11,875,153 B1 | 1/2024 | Raz et al. | |
| 2004/0060032 A1* | 3/2004 | McCubbrey | G06F 30/34 716/104 |
| 2016/0342722 A1* | 11/2016 | Sentieys | G06F 15/7871 |
| 2019/0042282 A1 | 2/2019 | Raz | |
| 2019/0079803 A1 | 3/2019 | Raz et al. | |
| 2023/0229444 A1 | 7/2023 | Raz et al. | |

(Continued)

FOREIGN PATENT DOCUMENTS

| | | |
|---|---|---|
| EP | 4213018 A1 | 7/2023 |
| WO | 2019055675 A1 | 3/2019 |
| WO | 2022149145 A1 | 7/2022 |

OTHER PUBLICATIONS

AMD customer community. (Dec. 14, 2020), 3pp. Available online: [https://adaptivesupport.amd.com/s/question/0D52E00006hpOrNSAU/number-of-times-you-can-program-the-zynq7000?language=en_US].

(Continued)

*Primary Examiner* — Mohammed Alam
(74) *Attorney, Agent, or Firm* — The Roy Gross Law Firm, LLC; Roy D. Gross

(57) ABSTRACT

An Integrated Circuit (IC) device, and a method of utilizing thereof, may include: a plurality of Processing Elements (PEs), each comprising one or more configurable hardware logic blocks. The IC may further include a plurality of configuration memory elements, each associated with a respective PE, and adapted to maintain two or more configuration settings of the respective PE. The IC may further include a configuration manager circuit, configured to: receive a reconfiguration instruction, dictating a required function of the IC device; based on the reconfiguration instruction, identify at least one target PE of the plurality of PEs as a target for reconfiguration; based on the required function, select a specific configuration setting in the configuration memory element associated with the at least one target PE; and reconfigure at least one hardware logic block of the at least one target PE, according to the selected configuration setting.

20 Claims, 7 Drawing Sheets

(56) References Cited

U.S. PATENT DOCUMENTS

2023/0244748 A1\* 8/2023 Natarja ............... G06N 3/063
2023/0342157 A1 10/2023 Raz et al.

OTHER PUBLICATIONS

X. Cui, Y. Chen and H. Mei, "Improving Performance of Matrix Multiplication and FFT on GPU," 2009 15th International Conference on Parallel and Distributed Systems, Shenzhen, China, 2009, pp. 42-48, doi: 10.1109/ICPADS.2009.8.

Li, Z., Wijerathne, D., Mitra, T. (2023). Coarse-Grained Reconfigurable Array (CGRA). In: Chattopadhyay, A. (eds) Handbook of Computer Architecture. Springer, Singapore. https://doi.org/10.1007/978-981-15-6401-7_50-1.

\* cited by examiner

RECONFIGURABLE INTEGRATED CIRCUIT (IC) DEVICE AND A SYSTEM AND METHOD OF CONFIGURING THEREOF

FIELD OF THE INVENTION

The present invention relates generally to electronic circuit devices. More specifically, the present invention relates to Integrated Circuit (IC) devices, and methods and mechanisms of configuring thereof.

BACKGROUND OF THE INVENTION

Reconfigurable hardware, such as Field-Programmable Gate Arrays (FPGAs) and Coarse-Grained Reconfigurable Arrays (CGRAs), has become increasingly popular due to its flexibility and adaptability in executing a variety of computational tasks. These devices can be tailored to specific applications through reconfiguration, offering performance and energy efficiency advantages over traditional, fixed-function hardware, which are optimized to a wide range of applications (general purpose). However, one significant shortcoming of currently available reconfigurable hardware technology is the long reconfiguration period, which limits their effectiveness in handling real-time changes in the type of tasks.

CGRAs, despite their flexibility in handling diverse high-level applications, often suffer from lengthy reconfiguration processes. The time required to adjust the configuration of the processing elements and the interconnect fabric can be substantial, impacting the ability of CGRAs to quickly adapt to changing workloads. This latency in reconfiguration reduces their suitability for real-time and dynamic applications, where rapid responsiveness is crucial.

Similarly, FPGAs, known for their fine-grained reconfigurability and precise control over computational tasks, also face challenges with reconfiguration times. Programming an FPGA to switch between different tasks or optimize for varying conditions is a lengthy process, hindering the deployment of FPGAs in applications where quick adaptability is essential.

There is therefore a need for advancements in reconfigurable hardware technologies that can significantly reduce reconfiguration times, thereby enhancing their practicality and integration into modern, real-time, adapting High Performance Computing (HPC) environments.

SUMMARY OF THE INVENTION

Embodiments of the invention may include an Integrated Circuit (IC) device. The IC device may include a plurality of Processing Elements (PEs), where one or more (e.g., each) PE may include one or more configurable hardware logic blocks. Additionally, the reconfigurable IC device may include a plurality of configuration memory elements, each associated with a respective PE, and adapted to maintain two or more configuration settings of the respective PE.

In some embodiments, each configuration memory element may be uniquely associated (e.g., included in, or physically adjacent) the respective PE. Additionally, or alternatively, one or more configuration memory elements may be associated with a group, or subset of respective PEs.

Additionally, or alternatively, the reconfigurable IC device may include a configuration manager circuit, adapted to receive a reconfiguration instruction, dictating a required function of at least a portion of (e.g., one or more PEs of) the IC device. Based on the reconfiguration instruction, the configuration manager circuit may identify at least one target PE of the plurality of PEs as a target for reconfiguration. Additionally, based on the reconfiguration instruction (e.g., on the required function), the configuration manager circuit may select a specific configuration setting in the configuration memory element associated with the at least one target PE. As elaborated herein, the configuration manager circuit may subsequently communicate with, or control the target PE to reconfigure at least one hardware logic block of the at least one target PE, according to the selected configuration setting, thereby reconfiguring the operation of the IC.

According to some embodiments, the one or more hardware logic blocks may include (i) a computational unit, and (ii) at least one set of configuration registers. The configuration manager circuit may be further configured to calculate a difference between a current configuration setting, and a previous, or default configuration setting of the two or more configuration settings. The configuration manager circuit may then load the calculated difference to a set of configuration registers in a specific hardware logic block of the at least one target PE. The configuration manager circuit may thereby reconfigure operation of the specific hardware logic block of the at least one target PE.

Additionally, or alternatively, the at least one identified target PE may include a plurality of target PEs, and the one or more hardware logic blocks comprise at least one set of configuration registers. The configuration manager circuit may further be configured to (a) halt operation of the plurality of target PEs, (b) load the selected configuration setting from the configuration memory element of the target PE to specific sets of configuration registers of respective target PEs, and (c) restart, or resume operation of the plurality of target PEs concurrently, in parallel, following the loading of the configuration registers. The configuration manager circuit may thereby allow the specific sets of configuration registers to control operation of respective target PEs, thus reconfiguring operation of the plurality of target PEs, substantially simultaneously.

According to some embodiments, at least one hardware logic block of the one or more hardware logic blocks of the plurality of PEs may include (i) a computational, or arithmetic unit, and (ii) at least two sets of configuration registers. The configuration manager circuit may be adapted to reconfigure a target PE by (a) loading the selected configuration setting from the configuration memory element of the target PE to a specific set of configuration registers of the at least two sets of configuration registers; and (b) switching the specific set of configuration registers to control operation of the computational unit of the target PE.

According to some embodiments, the configuration manager circuit may reconfigure a function of a plurality of PEs simultaneously, thereby decreasing a latency of the reconfiguration process. For example, the at least one identified target PE may include a plurality of target PEs, and the configuration manager circuit may be adapted to control a respective plurality of switches, each pertaining to a specific PE, to configure the plurality of target PEs in parallel, substantially simultaneously.

According to some embodiments, the configuration manager circuit may be adapted to, based on the reconfiguration instruction, produce a plurality of read access requests, where each read access request: (i) designates a specific target PE as a recipient, and (ii) includes a reference to the selected configuration setting in the configuration memory element associated with the recipient target PE. The configuration manager circuit may subsequently receive, from each PE of the plurality of target PEs, a load-complete indication, representing finalization of loading the configuration setting onto at least one hardware logic block of that PE. The configuration manager circuit may then simultaneously control switches of the plurality of target PEs, to switch a configuration (e.g., change a function of) the plurality of target PEs. Consequently, each target PE may operate according to a respective loaded configuration setting, thereby providing the required function dictated by the reconfiguration instruction.

Additionally, or alternatively, each PE may include at least one configuration bus, concatenating the hardware logic blocks of that PE. Each hardware logic block may include a set of configuration registers, adapted to control operation of that hardware logic block. In such embodiments, each recipient PE may be adapted to receive, from the respective configuration memory element, a response to the read access request. Based on the response, each recipient PE may produce a configuration data stream, that may include one or more entries. Each recipient PE may then propagate the configuration data stream through the hardware logic blocks via the at least one configuration bus, to load the sets of configuration registers of individual hardware logic blocks. Once done, each recipient PE may produce the load-complete message, indicating that the configuration data stream has traversed a last hardware logic block of its concatenated hardware logic blocks.

According to some embodiments, the at least one configuration bus may include a plurality of configuration buses, each concatenating a unique portion of hardware logic blocks of the recipient PE. Embodiments of the invention may thereby further improve a latency of PE reconfiguration.

According to some embodiments, each entry of the configuration data stream may include (i) an identification of one or more configuration registers in a hardware logic block of the recipient PE, and (ii) configuration data, to be loaded to the identified one or more configuration registers.

Additionally, or alternatively, the configuration data may include a calculated difference between a current configuration setting of the two or more configuration settings, and a previous configuration setting of the two or more configuration settings.

According to some embodiments, the IC device may further include a plurality of program data memory elements (e.g., cache memory elements). Each program data memory element may be associated with a specific PE of the one or more identified PEs. Additionally, or alternatively, the two or more configuration settings may correspond to respective, consecutive stages in a pipeline of a computational process. The configuration manager circuit may thus be adapted to configure the at least one hardware logic block of the identified at least one PE during run-time, while maintaining content of the respective program data memory element. In other words, the configuration manager circuit may transfer program data between stages of the pipeline (e.g., between different configurations), as in a relay race.

In some aspects of the invention, the configuration manager circuit may select target PEs for reconfiguration based on their completion of stages in the pipeline of the computational process, so as to optimally utilize the transfer of program data between the stages of the pipeline.

Additionally, or alternatively, the IC device may be adapted to execute a multi-thread application, wherein each thread of the application may include a series of hardware-implemented functions.

For example, the IC device may include a reconfiguration scheduler, including, or adapted to employ a plurality of buffer devices, each dedicated to managing execution of a specific hardware-implemented function by one or more threads of the multi-thread application. The reconfiguration scheduler may monitor congestion of the buffer devices, to identify a required change in a function of at least one hardware logic block. The reconfiguration scheduler may subsequently select target PEs for reconfiguration, and produce the reconfiguration instruction, based on the identification of congestion.

Additionally, or alternatively, one or more PEs of the plurality of PEs may be configured to determine a requirement for reconfiguration of one or more other PEs in the IC device, and subsequently produce the reconfiguration instruction, based on said determined requirement.

Embodiments of the invention may include a reconfigurable IC device that may include a plurality of PEs, where each PE includes at least two sets of configuration registers. Additionally, the reconfigurable IC device may include at least one (e.g., a plurality of) configuration memory elements, each associated with a respective PE, and adapted to maintain at least one configuration setting of the respective PE.

The reconfigurable IC device may further include a configuration manager circuit, configured to receive a reconfiguration instruction, dictating a required function of at least a portion of (e.g., one or more PEs of) the IC device. Based on the reconfiguration instruction, the configuration manager circuit may identify at least one target PE of the plurality of PEs as a target for reconfiguration. The configuration manager circuit may then load the at least one configuration setting from the configuration memory element associated with the target PE to a specific set of configuration registers of the at least two sets of configuration registers, and switch the specific set of configuration registers, to control operation of the target PE.

According to some embodiments, the at least one identified target PE may include a plurality of target PEs. The configuration manager circuit may be adapted to configure the plurality of target PEs in parallel, by switching the respective configuration registers substantially simultaneously.

Additionally, or alternatively, at least one first configuration memory element of the plurality of configuration memory elements may be adapted to maintain a plurality of configuration settings of a respective, first target PE. The configuration manager circuit may thus be further adapted to: based on the required function, select a specific configuration setting of the plurality of configuration settings in the at least one first configuration memory element; load the selected, specific configuration setting to a set of configuration registers of the respective, first target PE; and switch the set of configuration registers in the first target PE, to control operation of the first target PE.

Additionally, or alternatively, at least one second configuration memory element of the plurality of configuration memory elements may be adapted to maintain a calculated difference between a current configuration setting of a respective, second target PE and a subsequent configuration setting of the respective, second target PE. The configuration manager circuit may thus be adapted to: based on the required function, load the calculated difference to a set of configuration registers of the respective, second target PE; and switch the set of configuration registers in the second target PE, to control operation of the second target PE.

Embodiments of the invention may include a method of reconfiguring an IC device. Embodiments of the method may include obtaining an IC device, that may include a plurality of PEs. Each PE may include at least two sets of configuration registers. The obtained IC device may further include a plurality of configuration memory elements, each associated with a respective PE, and adapted to maintain at least one configuration setting of the respective PE. The obtained IC device may further include a configuration manager circuit, as described herein.

Embodiments of the method may further include adapting the configuration manager circuit to: receive a reconfiguration instruction, dictating a required function of at least a portion of (e.g., one or more PEs of) the IC device. Based on the reconfiguration instruction, embodiments may identify at least one target PE of the plurality of PEs as a target for reconfiguration; load the at least one configuration setting from the configuration memory element associated with the target PE to a specific set of configuration registers of the at least two sets of configuration registers; and switch the specific set of configuration registers, to control operation of the at least one target PE.

According to some embodiments, one or more (e.g., each) configuration memory elements of the plurality of configuration memory elements may be adapted to maintain a plurality of configuration settings of the respective PE. Embodiments of the invention may thus include adapting the configuration manager circuit to: based on the required function, select a specific configuration setting of the plurality of configuration settings, in a configuration memory element associated with the at least one target PE; and load the selected configuration setting to the specific set of configuration registers, thereby reconfiguring the at least one target PE.

According to some embodiments, the at least one identified target PE may include a plurality of target PEs. Embodiments of the method may thus include adapting the configuration manager circuit to: based on the reconfiguration instruction, produce a plurality of read access requests, wherein each read access request: (i) designates a specific target PE as a recipient, and (ii) includes a reference to the selected configuration setting in the configuration memory element associated with the recipient target PE; receive, from each PE of the plurality of target PEs, a load-complete indication, representing finalization of loading the configuration setting onto at least one hardware logic block of that PE; and simultaneously switch the plurality of target PEs, such that each target PE operates according to a respective loaded configuration setting, thereby providing the required function, as dictated by the reconfiguration instruction.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
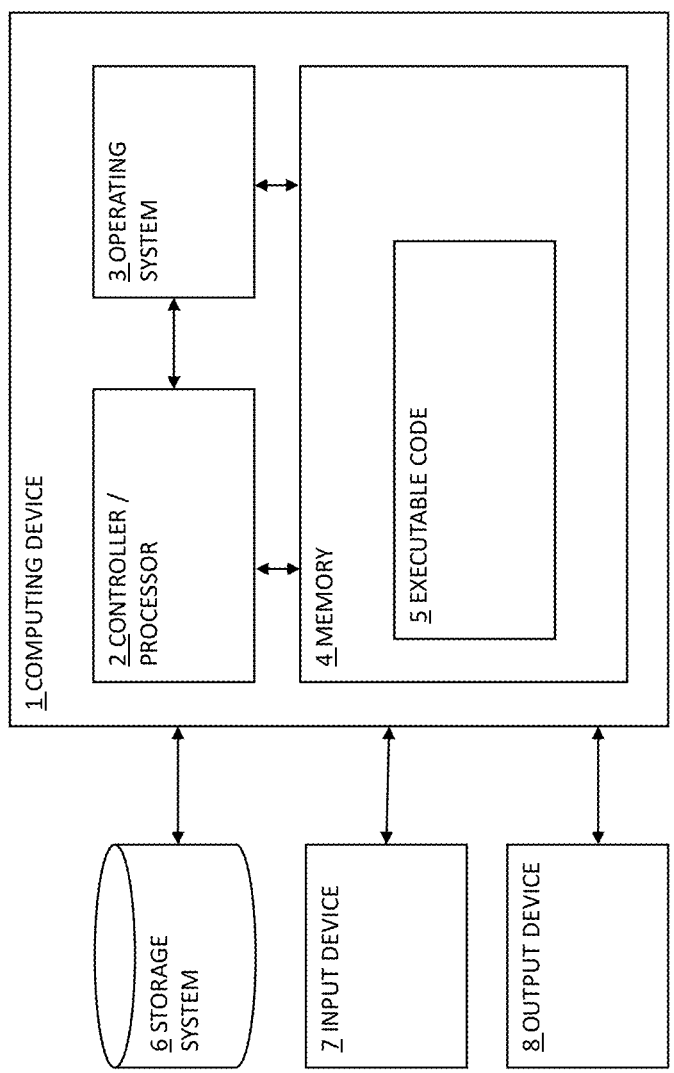
FIG. 1 is a block diagram, depicting a computing device which may be included in a system for configuring a reconfigurable Integrated Circuit (IC) device, according to some embodiments.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term "set" when used herein may include one or more items.

Unless explicitly stated, the method embodiments described herein are not constrained to a particular order or sequence. Additionally, some of the described method embodiments or elements thereof can occur or be performed simultaneously, at the same point in time, or concurrently.

Reference is now made to FIG. 1, which is a block diagram depicting a computing device, which may be included within a reconfigurable hardware device or system, according to some embodiments of the invention.

Computing device 1 may include a processor or controller 2 that may be, for example, a central processing unit (CPU) processor, a chip or any suitable computing or computational device, an operating system 3, a memory 4, executable code 5, a storage system 6, input devices 7 and output devices 8. Processor 2 (or one or more controllers or processors, possibly across multiple units or devices) may be configured to carry out methods described herein, and/or to execute or act as the various modules, units, etc. More than one computing device 1 may be included in, and one or more computing devices 1 may act as the components of, a system according to embodiments of the invention.

Operating system 3 may be or may include any code segment (e.g., one similar to executable code 5 described herein) designed and/or configured to perform tasks involving coordination, scheduling, arbitration, supervising, controlling or otherwise managing operation of computing device 1, for example, scheduling execution of software programs or tasks or enabling software programs or other modules or units to communicate. Operating system 3 may be a commercial operating system. It will be noted that an operating system 3 may be an optional component, e.g., in some embodiments, a system may include a computing device that does not require or include an operating system 3.

Memory 4 may be or may include, for example, a Random-Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 4 may be or may include a plurality of possibly different memory units. Memory 4 may be a computer or processor non-transitory readable medium, or a computer non-transitory storage medium, e.g., a RAM. In one embodiment, a non-transitory storage medium such as memory 4, a hard disk drive, another storage device, etc. may store instructions or code which when executed by a processor may cause the processor to carry out methods as described herein.

Executable code 5 may be any executable code, e.g., an application, a program, a process, task, or script. Executable code 5 may be executed by processor or controller 2 possibly under control of operating system 3. For example, executable code 5 may be an application that may reconfigure a hardware device, as further described herein. Although, for the sake of clarity, a single item of executable code 5 is shown in FIG. 1, a system according to some embodiments of the invention may include a plurality of executable code segments similar to executable code 5 that may be loaded into memory 4 and cause processor 2 to carry out methods described herein.

Storage system 6 may be or may include, for example, a flash memory as known in the art, a memory that is internal to, or embedded in, a micro controller or chip as known in the art, a hard disk drive, a CD-Recordable (CD-R) drive, a Blu-ray disk (BD), a universal serial bus (USB) device or other suitable removable and/or fixed storage unit. Data pertaining to hardware device configuration may be stored in storage system 6 and may be loaded from storage system 6 into memory 4 where it may be processed by processor or controller 2. In some embodiments, some of the components shown in FIG. 1 may be omitted. For example, memory 4 may be a non-volatile memory having the storage capacity of storage system 6. Accordingly, although shown as a separate component, storage system 6 may be embedded or included in memory 4.

Input devices 7 may be or may include any suitable input devices, components, or systems, e.g., a detachable keyboard or keypad, a mouse and the like. Output devices 8 may include one or more (possibly detachable) displays or monitors, speakers and/or any other suitable output devices. Any applicable input/output (I/O) devices may be connected to Computing device 1 as shown by blocks 7 and 8. For example, a wired or wireless network interface card (NIC), a universal serial bus (USB) device or external hard drive may be included in input devices 7 and/or output devices 8. It will be recognized that any suitable number of input devices 7 and output device 8 may be operatively connected to Computing device 1 as shown by blocks 7 and 8.

A system according to some embodiments of the invention may include components such as, but not limited to, a plurality of central processing units (CPU) or any other suitable multi-purpose or specific processors or controllers (e.g., similar to element 2), a plurality of input units, a plurality of output units, a plurality of memory units, and a plurality of storage units.

Figure 2:
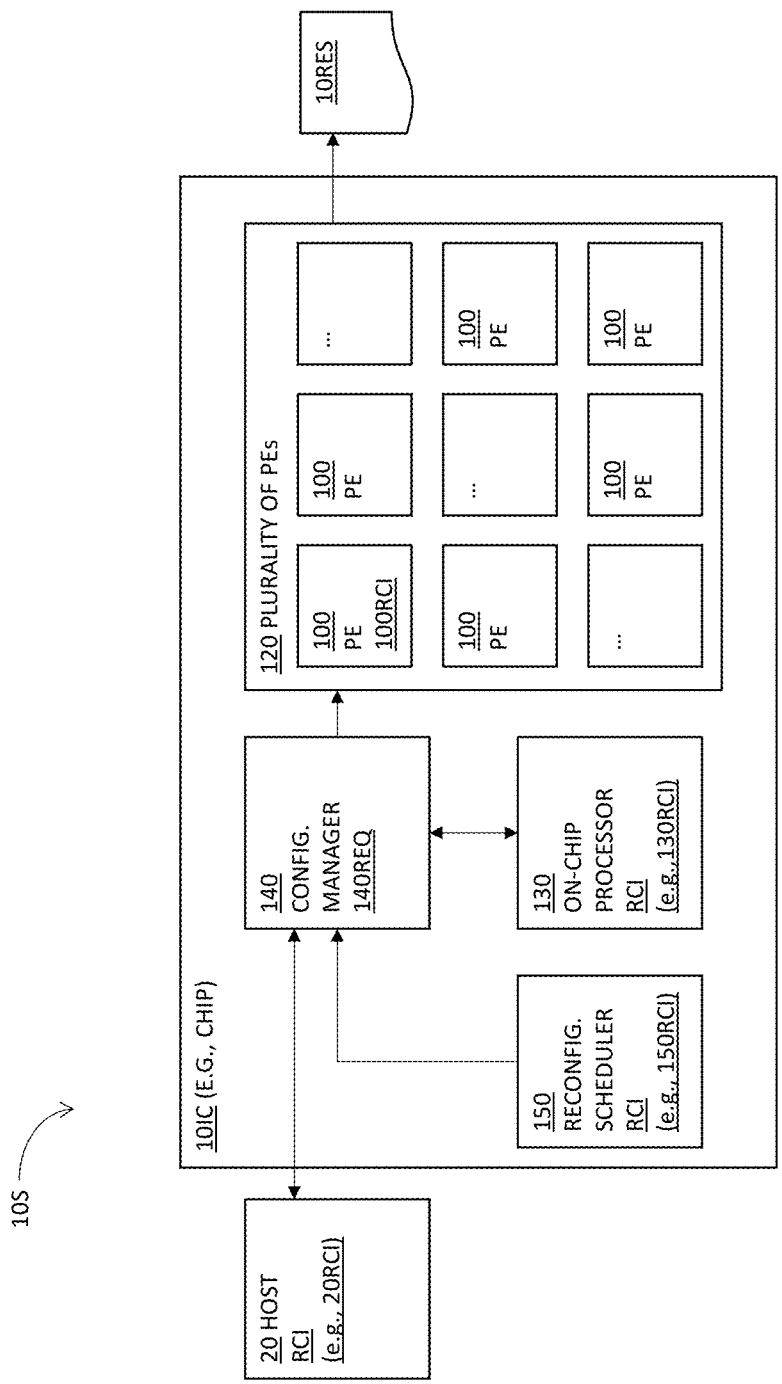
FIG. 2 is a block diagram depicting an IC device, and a system for configuring thereof, according to some embodiments of the invention.

Reference is now made to FIG. 2, which is a block diagram depicting a reconfigurable IC device 10IC, and a system 10S for configuring thereof, according to some embodiments of the invention. As shown in FIG. 2, arrows may represent flow of one or more data elements to and from system 10S and/or among modules or elements of system 10S. Some arrows have been omitted in FIG. 2 for the purpose of clarity.

According to some embodiments of the invention, reconfigurable IC device 10IC may be implemented as a reconfigurable chip, having a plurality 120 (e.g., an array) of interconnected Processing Elements (PEs) 100, where each PE 100 may include one or more configurable hardware logic blocks.

The terms "configurable" or "reconfigurable" may be used herein to indicate a property of IC device 10IC, by which one or more hardware logic blocks may be adapted, e.g., during operation, to implement different functions.

As elaborated herein, IC device 10IC may provide an improvement over currently available configurable devices such as Field Programmable Gate Arrays (FPGAs) and Coarse-Grained Reconfigurable Arrays (CGRAs): By uniquely designing PEs 100, and cleverly optimizing the decision and process of reconfiguration, embodiments of the invention may boost computational throughput and chip space utilization of IC device 10IC.

According to some embodiments, IC device 10IC may be adapted to execute a multi-thread application, where each thread may include a series of hardware-implemented functions or blocks, implemented by respective PEs.

For example, IC device 10IC may be configured to concurrently execute a plurality of processing threads, where each thread implements a machine-learning (ML) based model, or algorithm. The ML model may include, for example, an object detection algorithm, aiming to identify one or more objects that appear in an image. In this example, each thread may be dedicated to handling a specific, instant data example, such as a specific image of a plurality of substantially concurrent examples (e.g., a plurality of instant images).

It may be appreciated that the ML based algorithm may include a series of different functions or blocks, such as convolutional blocks and fully connected blocks, each requiring a different hardware configuration. Embodiments of the invention may apply a fast-reconfiguration scheme, to efficiently alternate between different functions (e.g., different blocks of the ML model), using the same hardware (e.g., on the same PEs). Embodiments of the invention may do so while locally maintaining results of a first function (e.g., a convolutional block) as input for a subsequent function (e.g., a fully-connected block). Embodiments of the invention may thereby create a "relay race" among different functions using the same space in the chip, without having to store and fetch program data between these functions.

In contrast, currently available configurable hardware chips (e.g., FPGAs, CGRAs) may require prohibitively long reconfiguration periods to alternate between different functions (different configurations) of the same PEs. Therefore, currently available configurable hardware chips are limited to serializing hardware blocks on the chip. This limitation results in (a) rigid, inefficient utilization of expensive chip space, and (b) inferior computation throughput.

IC device (e.g., chip) 10IC may include one or more embedded, on-chip processors 130 such as element 2 of FIG. 1. On-chip processor(s) 130 may be adapted to execute one or more modules of executable code (e.g., element 5 of FIG. 1) to implement methods of fast hardware (e.g., PE 100) reconfiguration on IC device 10IC, as further described herein.

Additionally, or alternatively, system 10S may include IC device 10IC, and at least one host computing device 20 such as element 1 of FIG. 1. Host computing device 20 may be adapted to execute one or more modules of executable code (e.g., element 5 of FIG. 1) to implement methods of fast hardware (e.g., PE 100) reconfiguration on IC device 10IC, as further described herein.

Figure 3A:
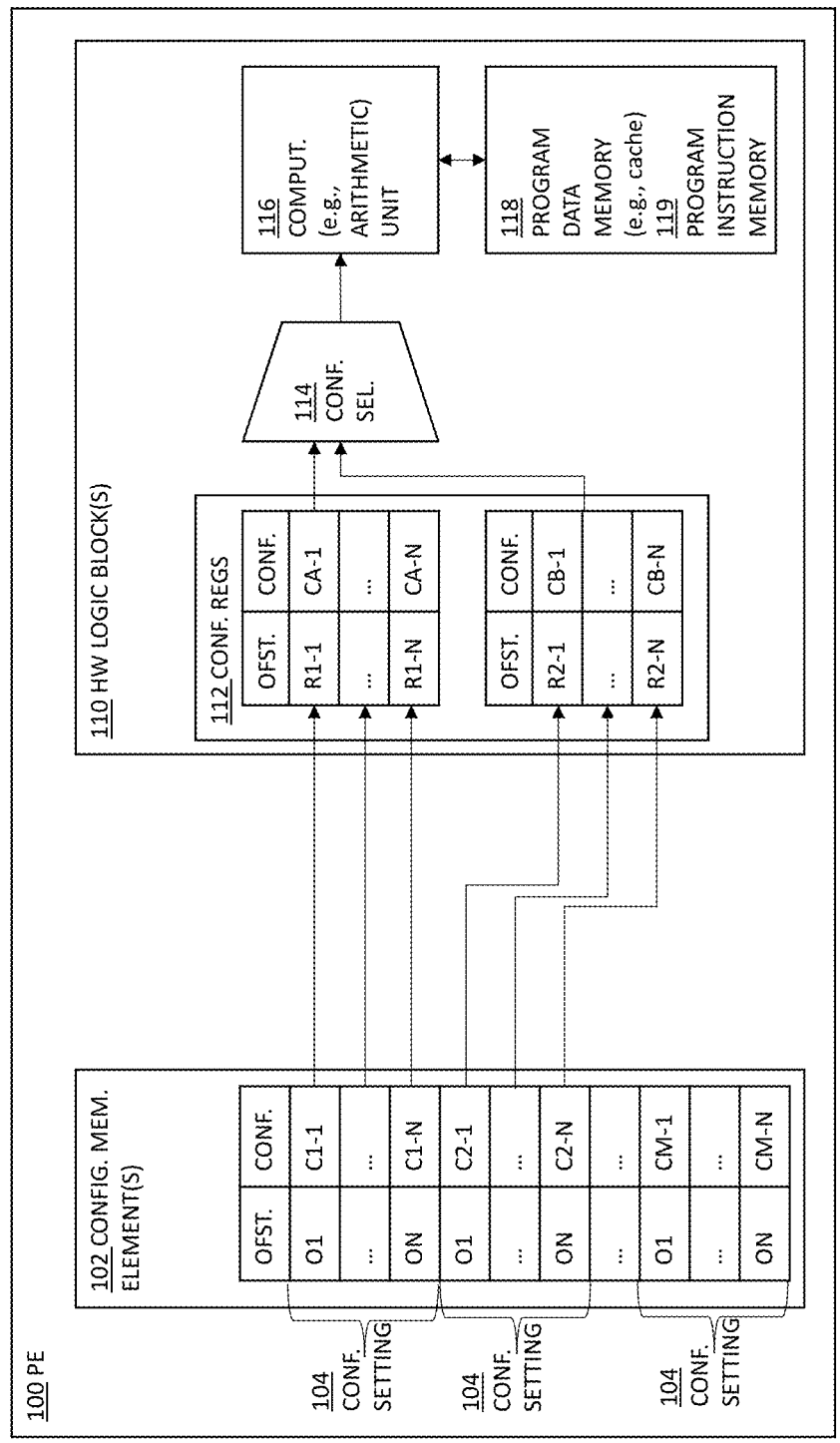
FIGS. 3A and 3B are block diagrams depicting aspects of a Processing Element (PE), which may be included in the IC device of FIG. 2, according to some embodiments of the invention.
Figure 3B:
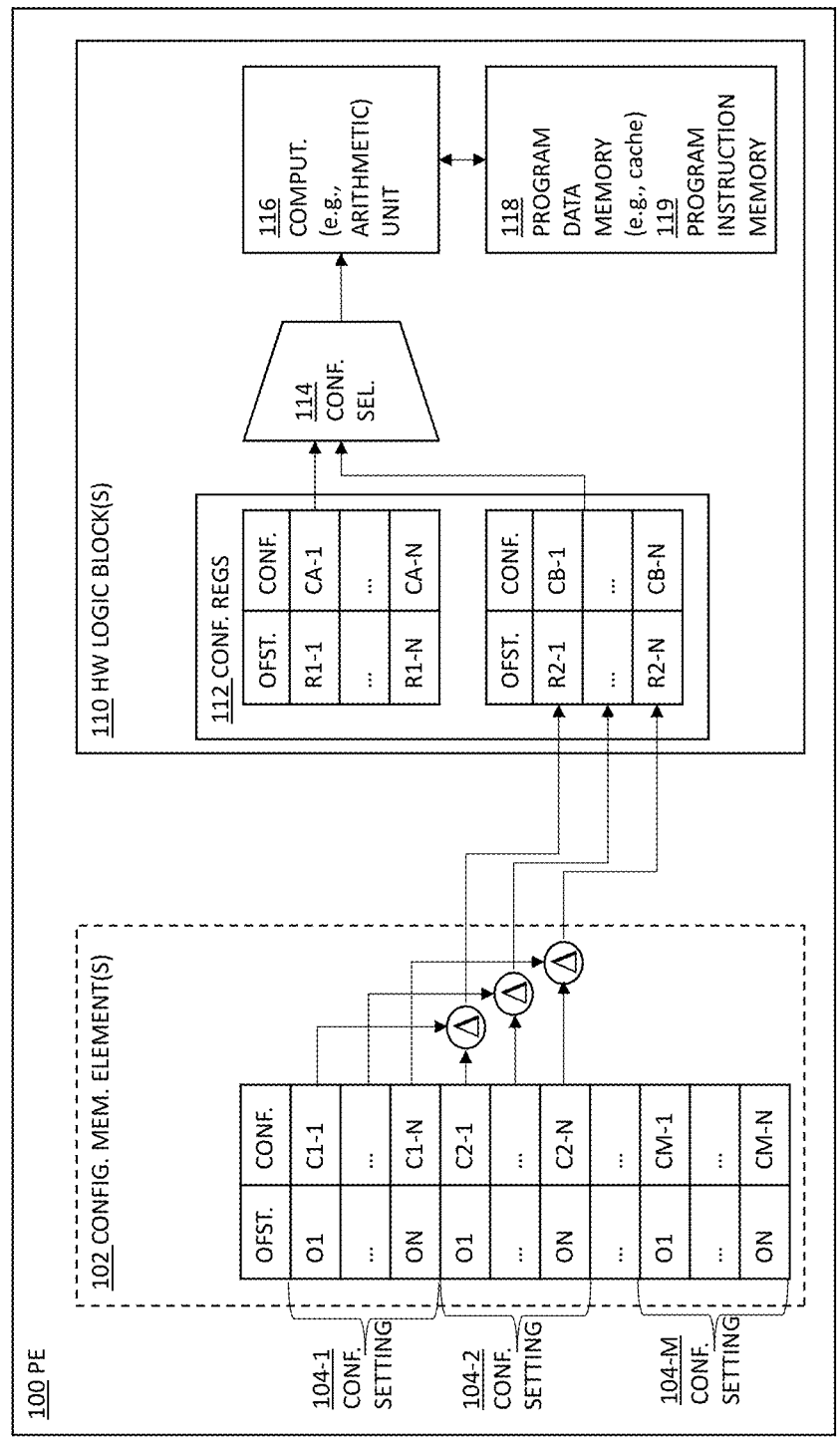

Reference is also made to FIGS. 3A and 3B, which are block diagrams depicting aspects of a PE 100, which may be included in IC device 10IC, according to some embodiments of the invention. PE 100 of FIGS. 3A, 3B may be the same as one or more (e.g., each) of PEs 100 of FIG. 2.

According to some embodiments, IC device 10IC may include a plurality of configuration memory elements 102, each associated with a respective PE 100. As shown in FIG. 3A, one or more configuration memory element(s) 102 may be included in, and thereby uniquely associated with respective PE 100. Additionally, or alternatively, one or more configuration memory element(s) 102 may be reside within IC device 10IC adjacent to a group of PEs 100, and may be uniquely associated with that group of PEs 100.

Each configuration memory element(s) 102 may be considered "local" to the respective, associated PE(s) 100. The term "local" may be used in this context to indicate close proximity between configuration memory element(s) 102 (or "memory 102" for short) and their associated PE(s) 100, that may exceed proximity of chip-scale 10IC or system-scale 10S memory devices. As may be appreciated by a person skilled in the art, such proximity may allow PEs 100 near-immediate retrieval of data that is locally stored on respective, associated configuration memory 102.

Configuration memory elements 102 may be dedicated to control a configuration of the associated PEs 100. As such, they may be distinct, and managed separately from other types of memory elements of PE 100.

One such other type of memory element may include, for example, a data memory (e.g., a cache memory) 118, that may maintain run-time computational data.

Another example of such other type of memory element may include a program instruction memory element 119 that may maintain instruction codes for operating at least one processing units (e.g., processor 130) associated with, or included in PE 100.

As shown in FIG. 3A, each memory 102 may be adapted to maintain two or more (e.g., a plurality of) configuration settings 104 of the respective, associated PE. For example, as depicted in FIG. 3A, memory 102 may be arranged as a table, that is partitioned into multiple configuration settings 104. Each partition may include a plurality of entries, relating to a respective plurality of configuration registers 112 of PE 100. Each entry of memory 102 may include an offset address (denoted O1, O2, . . . , ON) indicating a specific configuration register 112 (denoted R1-1 . . . R1-N, or R2-1 . . . R2-N), and a corresponding configuration-dependent value (denoted C1-1 . . . C1-N for the first configuration setting, C2-1 . . . C2-N for the second configuration setting, etc.).

According to some embodiments, IC device 10IC may include a plurality of program data memory elements 119 (e.g., cache memory elements), each associated with one or more (e.g., exactly one) PE 100 of the plurality of PEs. In some embodiments, the two or more configuration settings 104 may correspond to respective, consecutive stages in a pipeline of a computational process. Pertaining to the ML-based object detection algorithm, the stages in the pipeline may include computational blocks of the ML model, such as a convolutional block, a pooling block, a fully-connected block, an activation (e.g., rectified linear unit (ReLU)) block, and the like.

As shown in FIG. 2, IC device 10IC may include a configuration manager circuit 140. As the name implies, configuration manager circuit 140 (or "manager 140", for short) may be a hardware-based circuit, adapted to communicate configuration messages with one or more PEs, thereby controlling configuration of these PEs during run-time (e.g., without stalling operation of IC device 10IC).

According to some embodiments, manager 140 may configure the at least one hardware logic block 110 of at least one PE 100 during run-time, while maintaining content of the respective program data memory element 118, thereby transferring program data between stages of the pipeline.

According to some embodiments, manager 140 may receive a reconfiguration instruction (denoted RCI), dictating a required function of at least one portion of IC device 10IC. As elaborated herein, manager 140 may receive reconfiguration instruction RCI from host computing device 20 (denoted here 20RCI), or from an on-chip, embedded CPU or processor 130 (denoted here 130RCI).

Additionally, or alternatively, manager 140 may receive the reconfiguration instruction from an on-chip reconfiguration scheduler device 150 (denoted here 150RCI), as elaborated herein.

Additionally, or alternatively, manager 140 may receive the reconfiguration instruction from at least one PE 100 (denoted here 100RCI), as elaborated herein.

Pertaining to the example of the ML-based object detection model provided above: Host 20, processor 130 and/or scheduler 150 may identify a condition in which a bulk of instant images have undergone processing by a first function (e.g., a convolutional block) of the ML model, and are currently queuing to undergo processing by a second function (e.g., a fully connected block) of the ML model. Host 20, processor 130 and/or scheduler 150 may thereby identify a requirement to allocate more hardware resources (e.g., more PEs) in favor of the second function of the ML model.

Reconfiguration instruction RCI (e.g., 20RCI/100RCI/130RCI/150RCI) may thus include an identification (e.g., an address) of specific PEs 100, and their respective, required functionality.

Pertaining to the same example of the ML-based object detection model, reconfiguration instruction RCI may include a reference (e.g., an address) of one or more specific PEs 100 who have completed processing of the first function (e.g., the convolutional block), and are currently maintaining (e.g., in a cache or data memory 118) a computed result of that first function. Additionally, reconfiguration instruction RCI may include an indication or reference to a required, second function (e.g., a fully connected block) of these PEs 100.

Based on the reconfiguration instruction, manager 140 may identify at least one target PE 100 of the plurality of PEs 100 as a target for reconfiguration. Manager 140 may further select a specific configuration setting 104 in the configuration memory element 102 associated with that at least one target PE 100.

In relation to the example of the ML-based object detection model, an identified target PE 100 may be one who has completed computation of the first function (e.g., the convolutional block), and the selected configuration setting 104 may be one that implements the required, second function (e.g., the fully connected block).

As elaborated herein, manager 140 may proceed to reconfigure at least one hardware logic block 110 of the at least one target PE 100, according to the selected configuration setting.

As shown in FIG. 3A, at least one hardware logic block 110 of each PE 100 may include a set of configuration registers 112, and an arithmetic, or computational unit 116. Computational unit 116 may be adapted to perform a function (e.g., an arithmetic function), according to the value, or content of the set of configuration registers 112. For example, a first value of configuration registers 112 may dictate that computational unit 116 should (e.g., in collaboration with other computational or arithmetic units 116) implement a first function (e.g., matrix multiplication), and a second value of configuration registers 112 may dictate that computational unit 116 should implement a second function (e.g., a for-loop).

As shown in FIG. 3A, at least one (e.g., each) hardware logic block 110 may include at least two (e.g., exactly two) sets of configuration registers 112, denoted here by their offset addresses [R1-1 . . . R1-N] and [R2-1 . . . R2-N].

In such embodiments, configuration manager circuit 140 may control the target PE 100 so as to load the selected configuration setting 104 from the configuration memory element 102 of the target PE 100 to a specific set of configuration registers 112 (e.g., R1 or R2) of the at least two sets of configuration registers 112. Manager 140 may then control a configuration selection switch 114, to switch, or select the specific set of configuration registers 112, so as to control the operation of target PE 100 (e.g., of computational unit 116 of target PE 100). Manager 140 may thereby reconfigure the function of target PE 100.

It may be appreciated that by duplicating the set of configuration registers 112, embodiments of the invention may allow run-time loading of a pending configuration (e.g., a functionality) of PE 100 hardware logic blocks 110, and substantially instantaneous switching between different functionalities of the same hardware logic blocks 110.

In FIG. 3A, this switching of functionality is depicted as switching between a first functionality, defined by a first set of configuration register values [CA-1 . . . CA-N] and a second functionality, defined by a second set of configuration register values [CB-1 . . . CB-N].

In other words, at least one first configuration memory element 102 may be adapted to maintain a plurality of configuration settings of a respective target PE 100. Based on the required function of reconfiguration instruction RCI (20RCI/100RCI/130RCI/150RCI), configuration manager circuit 140 may select a specific configuration setting 104 of the plurality of configuration settings 104 in configuration memory element 102. Configuration manager circuit 140 may control the target PE 100 to load the selected, specific configuration setting 104 to a set of configuration registers (e.g., [R2-1 . . . R2-N]) of the respective target PE 100. Configuration manager circuit 140 may subsequently control switch 114 to switch the set of configuration registers (e.g., from [R1-1 . . . R1-N] to [R2-1 . . . R2-N]) in the target PE 100, thereby controlling operation of the target PE 100.

In the context of multiple sets of configuration registers 112, the term "switching" of configuration registers may be used in a sense of changing the configuration of computational units 116, from a first configuration setting 104 that is stored, or loaded upon a first set of configuration registers 112, to a second configuration setting 104 that is stored, or loaded upon a second set of configuration registers 112, thereby reconfiguring the operation of a hardware logic block 110.

Additionally, manager 140 may concurrently control a plurality of configuration selection switches 114, thereby concurrently reconfiguring the functionality of a respective plurality of PEs 100 and/or hardware logic blocks 110.

In other words, the at least one identified target PE 100 in reconfiguration instruction RCI (20RCI/100RCI/130RCI/150RCI) may include a plurality of target PEs 100. Manager 140 may therefore configure the plurality of target PEs 100 substantially simultaneously, in parallel.

Additionally, or alternatively, one or more hardware logic blocks 110 may include comprise at least one (e.g., exactly one) set of configuration registers 112. In such embodiments, configuration manager circuit 140 may halt operation of the plurality of target PEs 100, to load the selected configuration setting 104 from the configuration memory element 102 of the target PE 100 to respective sets of configuration registers 112 of respective target PEs 110. When all configuration registers 112 have been loaded, Configuration manager circuit 140 may restart operation of the plurality of the target PEs 100 in parallel.

In other words, configuration manager circuit 140 may concurrently allow the loaded sets of configuration registers 112 to control operation of respective hardware blocks 110 in the target PEs 100. Configuration manager circuit 140 may thus reconfigure operation of the plurality of target PEs 100, substantially simultaneously.

In such embodiments of single sets of configuration registers 112, the term "switching" of configuration registers 112 may be used in a sense of changing the configuration of computational units 116 in parallel, from a first configuration setting 104, to a second configuration setting 104, by (a) pausing or halting operation of computational units 116, (b) loading the configuration registers 112, and (c) concurrently resuming, or restarting operation of computational units 116, thereby reconfiguring the operation of hardware logic block(s) 110 of one or more target PEs 100.

Additionally, or alternatively, at least one configuration memory element 102 of the plurality of configuration memory elements may maintain, or store a calculated difference between a current configuration setting 104 (e.g., 104-1) of a respective, target PE 100 and a subsequent configuration setting 104 (e.g., 104-2) of the respective target PE 100. As shown in FIG. 3B, this difference between configuration setting 104 may be calculated by a one or more comparator modules, denoted by the symbol 'Δ'.

Based on the required function of reconfiguration instruction RCI (20RCI/100RCI/130RCI/150RCI), configuration manager circuit 140 control target PE 100 to load the calculated difference (Δ) to a set of configuration registers (e.g., [R2-1 . . . R2-N]) of the respective target PE 100. Configuration manager circuit 140 may subsequently control switch 114 to switch the set of configuration registers (e.g., from [R1-1 . . . R1-N] to [R2-1 . . . R2-N]) in the target PE 100, thereby controlling operation of the target PE 100 according to a difference between configuration settings 104 (e.g., 104-1 and 104-2).

Additionally, or alternatively, one or more hardware logic blocks 110 may include (i) a computational unit 116 and (ii) at least one (e.g., exactly one) set of configuration registers. Configuration manager circuit 140 may be configured to calculate a difference (Δ) between a current configuration setting 104, and a previous, or default configuration setting 104 of the two or more configuration settings. Configuration manager circuit 140 may then load the calculated difference (Δ) to a set of configuration registers 112 in a specific hardware logic block 110 of the at least one target PE 100. Configuration manager circuit 140 may thereby reconfigure operation of the specific hardware logic block 110 of the at least one target PE 100.

According to some embodiments, manager 140 may produce one or more (e.g., a plurality of) read access requests 140REQ, based on the reconfiguration instruction. Read access requests 140REQ may be messages designated to specific target PEs as recipients, and may include a reference to the selected configuration setting 104 in the configuration memory element 102 associated with the recipient target PEs 100.

Additionally, or alternatively, read access requests 140REQ may include references to offset addresses of specific configuration registers (e.g., O1, ON, R1-1) and/or specific values to be loaded into these addresses (e.g., CA-1, CA-N, CB-1).

Depending on the number and location of recipient target PEs 100, manager 140 may transmit, multicast or broadcast read access requests 140REQ to the one or more (e.g., plurality) configuration memory elements 102 of the recipient target PEs 100.

Figure 4:
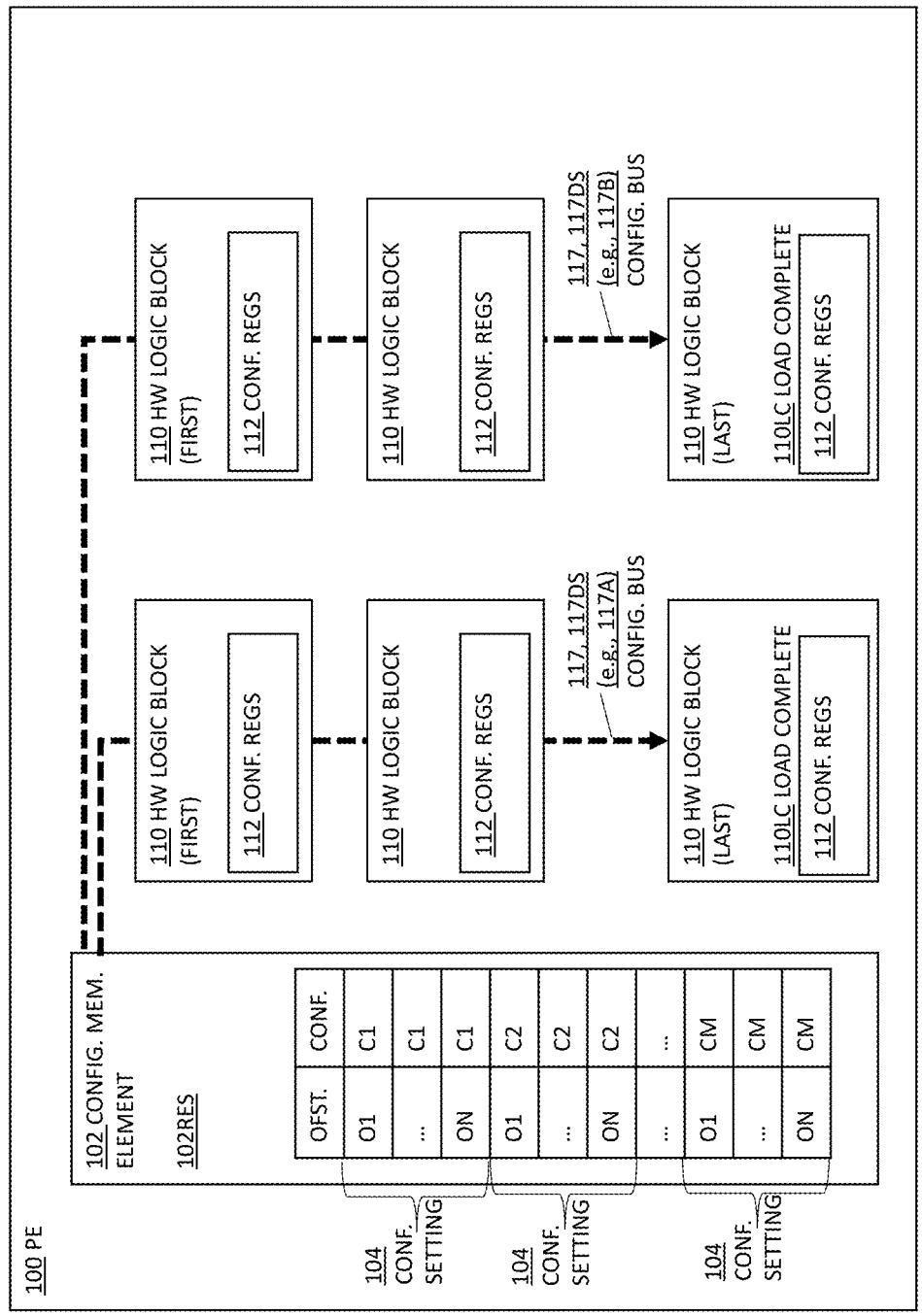
FIG. 4 is a block diagram depicting additional aspects of a PE, which may be included in the IC device of FIG. 2, according to some embodiments of the invention.

Reference is also made to FIG. 4, which is a block diagram depicting additional aspects of a PE 100, which may be included in IC device 10IC, according to some embodiments of the invention. PE 100 of FIG. 4 may be the same as one or more (e.g., each) of PEs 100 of FIGS. 2 and 3.

As explained above, each hardware logic block 110 may include a set of configuration registers, adapted to control operation of that hardware logic block 110. Additionally, each PE 100 may include at least one configuration bus 117 (e.g., 117A, 117B), concatenating one or more hardware logic blocks 110 of that PE 100.

According to some embodiments, each recipient target PE 100 may receive, from the respective PE's 100 configuration memory element 102, a response 102RES to the read access request 140REQ. Response 102RES may include configuration values (e.g., C1-1 . . . CM-N) of respective registers (denoted by offset addresses O1 . . . ON of respective configuration setting partitions 104).

As elaborated herein, read access request 140REQ may include a reference (e.g., an address) of one or more specific recipient targets PE 100. Recipient targets PE 100 may therefore receive response(s) 102RES directly from their respective configuration memory element(s) 102.

Additionally, or alternatively, recipient targets PE 100 may receive response(s) 102RES from configuration memory element(s) 102 via some routing entity.

For example, configuration memory element(s) 102 may return response(s) 102RES to manager 140, which may direct, or route response(s) 102RES to the designated recipient targets PE 100.

In another example, configuration memory element(s) 102 may return response(s) 102RES to host 20 or processor 130, which may in turn direct, or route response(s) 102RES to the designated recipient targets PE 100.

Based on response 102RES, PE 100 may produce a configuration data stream 117DS that includes one or more entries. For example, when a change is required in a value of a configuration register 112 of a specific hardware logic block 110, then PE 100 may append a "change" entry to configuration data stream 117DS. The "change" entry may refer to one or more relevant registers 112 (the relevant offset address O1 . . . ON) of that hardware logic block 110, and include one or more relevant configuration values (e.g., C1-1 . . . CM-N, as determined by response 102RES). In other words, each entry (e.g., each "change" entry) of the configuration data stream 117DS may include comprises (i) an identification of one or more configuration registers 112 in a hardware logic block 110 of the recipient PE 100 (e.g., an identification of the logic block 110 and an offset address within that block), and (ii) configuration data, to be loaded to the identified one or more configuration registers.

Additionally, or alternatively, the configuration data may include a calculated difference between a current configuration setting of the two or more configuration settings 104, and a previous configuration setting 104 of the two or more configuration settings.

Alternatively, if no change is required in a configuration register 112 of a hardware logic block 110, then PE 100 may append a "pass" entry to configuration data stream 117DS, indicating that no reconfiguration action is required.

As shown in FIG. 4, PE 100 may propagate the configuration data stream 117DS through its member hardware logic blocks 110, via the at least one configuration bus 117 (e.g., 117A, 117B), to load the sets of configuration registers 112 of individual hardware logic blocks 110 with data stored in memory 102 (e.g., as included in response 102RES).

According to some embodiments, the at least one configuration bus 117 may include a plurality of configuration buses (e.g., 117A, 117B), each concatenating a unique portion of hardware logic blocks 110 of the recipient PE 100.

It may be appreciated that by using a plurality of configuration buses 117 (e.g., 117A, 117B), and intelligently selecting functionally related hardware logic blocks 110 to be concatenated in each of the configuration buses 117, embodiments of the invention may further boost the process of hardware reconfiguration, allowing low latency, real-time switching between different functions of the same PEs 100.

According to some embodiments, PE 100 may subsequently produce a load-complete indication 110LC, representing finalization of loading the configuration setting onto at least one hardware logic block 110 of that PE.

For example, load-complete indication 110LC may indicate that configuration data stream 117DS has traversed a last hardware logic block 110 of the concatenated hardware logic blocks 110, in one or more (e.g., all) configuration buses 117 of that PE 100.

According to some embodiments, manager 140 may receive the load-complete indication 110LC from one or more (e.g., each) target PE 100 of the one or more (e.g., plurality of) target PEs 100.

For example, manager 140 may receive the load-complete indication 110LC as an interrupt (e.g., an unsynchronous interrupt) from the one or more target PEs 100.

In another example, manager 140 may manage a polling process among the one or more target PEs 100, to determine completion of the loading process in one or more (e.g., each) of the target PEs 100, to ascertain a value (e.g., a binary 'True' or 'False' value) of the load-complete indication 110LC.

Following reception of the load-complete indication(s) 110LC, manager 140 may control reconfiguration switches 114 of the one or more target PEs 100. Manager 140 may thereby simultaneously switch the one or more (e.g., plurality of) target PEs 100, such that each PE 100 may operate according to a respective loaded configuration setting 104. In other words, manager 140 may simultaneously configure a plurality of PEs 100 to provide the required function dictated by the reconfiguration instruction RCI (20RCI/ 100RCI/130RCI/150RCI).

Figure 5:
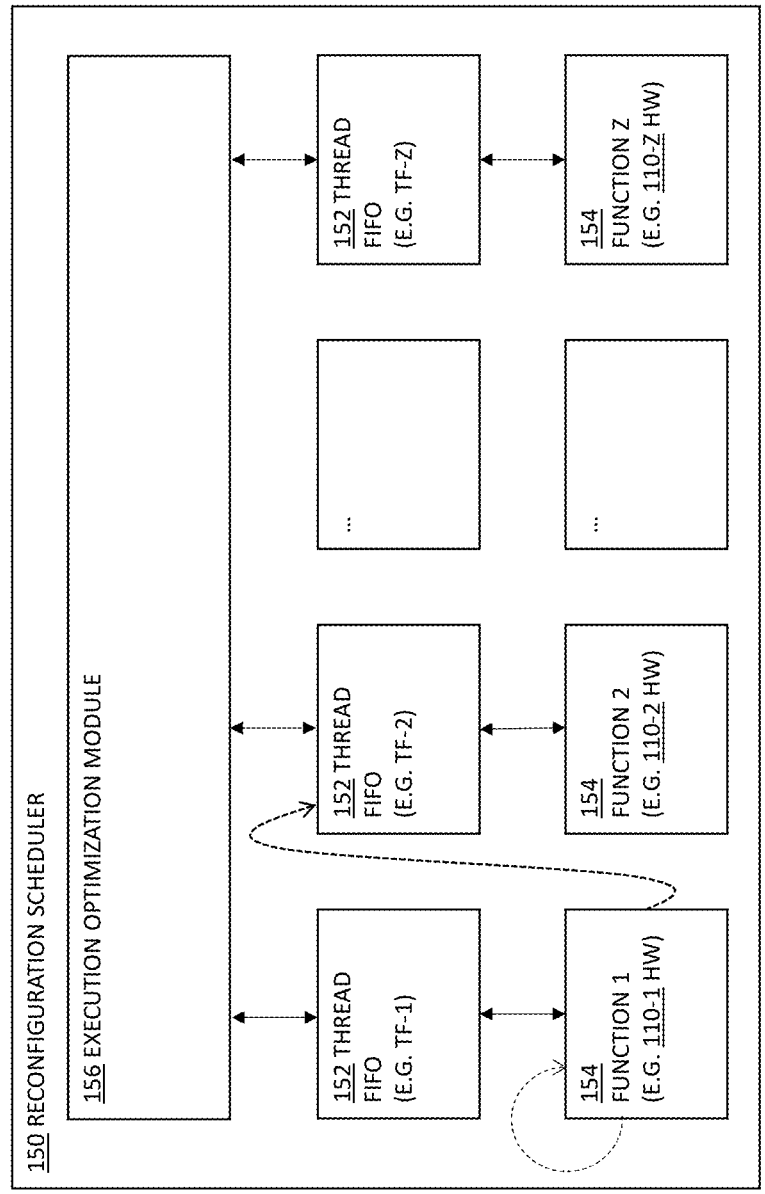
FIG. 5 is a block diagram depicting aspects of a reconfiguration scheduler, which may be included in the IC device of FIG. 2, according to some embodiments of the invention.

Reference is now made to FIG. 5, which is a block diagram depicting aspects of a reconfiguration scheduler 150, which may be included in the IC device 10IC of FIG. 2, according to some embodiments of the invention. Reconfiguration scheduler 150 (or "scheduler 150", for short) may be the same as scheduler 150 of FIG. 2.

As shown in FIG. 5, scheduler 150 may include a plurality of buffer devices such as First-In, First-Out (FIFO) devices 152. Each buffer or FIFO 152 may be dedicated to managing execution of a specific hardware-implemented function by one or more threads of the multi-thread application.

Pertaining to the ML-based object detection example, an overall number (e.g., N) of threads may be currently active in detecting objects in a corresponding number (e.g., N) of instant data examples (e.g., images).

A first number (e.g., $n1$) of threads may currently be handling a first function (function 1, e.g., a convolutional block) of the ML-based algorithm. A portion $n1$-$e$ of the $n1$ number of threads may be actively executing the first function by appropriately configured hardware blocks 110 (e.g., 110-1), while another portion $n1$-$q$ of the $n1$ number of threads may be queued in the first thread FIFO (TF-1).

In a similar manner, a second number (e.g., $n2$) of threads may currently be handling a second function (function 2, e.g., a pooling block), where a portion $n2$-$e$ may be actively executing function 2 by appropriately configured hardware blocks 110 (e.g., 110-2), while another portion $n2$-$q$ may be queued in the second thread FIFO (TF-2), and so on.

According to some embodiments, an execution optimization module 156 (or "optimizer 156" for short) may monitor, and analyze congestion of the buffer (e.g., FIFO) 152 devices, to identify a required change in a function of at least one hardware logic block.

For example, when a specific thread FIFO 152 (e.g., TF-2) is full beyond a predetermined threshold (e.g., referred to herein as "congested"), optimizer 156 may deduce that additional PEs 100 and/or member hardware blocks 110 should be allocated to the function (e.g., function 2) which corresponds to the congested thread FIFO 152 (TF-2).

Scheduler 150 may subsequently produce a reconfiguration instruction RCI (e.g., 150RCI), based on the identified condition of congestion. Pertaining to the same example, reconfiguration instruction 150RCI may include (i) an identification of one or more selected target PEs 100 (and/or member hardware blocks 110), and (ii) a reference to a configuration setting 104 associated with the congested function (e.g., function 2), to be loaded into configuration registers 112 of the selected target PEs 100. The target PEs 100 may be selected, for example, as ones who have recently finalized computation of a preceding function (e.g., function 1), and therefore currently maintain (e.g., in program data element 118) a computed outcome of the preceding function (e.g., function 1).

Additionally, or alternatively, one or more specific PEs 100 may be configured to implement logic for determining content of a reconfiguration instruction RCI (now denoted 100RCI).

In other words, host 20, one or more specific PEs 100, and/or on-chip processor 130 may be configured to implement a decision function, to determine a requirement for reconfiguration of one or more other PEs 100 in the IC device. Host 20, the specific PEs 100, and/or on-chip processor 130 may and subsequently produce a reconfiguration instruction (e.g., 20RCI/100RCI/130RCI respectively), to reconfigure the one or more other PEs 100, based on said determined requirement.

For example, the one or more specific PEs 100 may be configured to implement a reconfiguration scheduler module, such as reconfiguration scheduler module 150 of FIG. 5. In such embodiments, one or more specific PEs 100 may be configured to produce at least one reconfiguration instruction 100RCI, that may include (i) an identification of one or more other, selected target PEs 100 (and/or member hardware blocks 110), and (ii) a reference to at least one configuration setting 104, for loading into the selected target PEs 100, as elaborated herein (e.g., in relation to FIG. 5).

In another example, at least one host 20, one or more specific PEs 100, and/or on-chip processor 130 may be configured to implement logic for serial implementation of functions in a process or a thread of an application. During runtime, host 20, PEs 100, and/or on-chip processor 130 may determine that a first function (e.g., "function 1") of the process or thread has been executed (e.g., by monitoring a program counter (PC), as known in the art). Host 20, PEs 100, and/or on-chip processor 130 may then determine that a subsequent function (e.g., "function 2") of the process or thread should be executed by PEs 100 of the IC device 10IC. Host 20, PEs 100, and/or on-chip processor 130 may consequently generate a reconfiguration instruction (20RCI/ 100RCI/130RCI, respectively), to reconfigure the one or more other PEs 100, to implement function 2 of the process or thread.

It may be appreciated that any permutation, or combination in generation of RCIs (20RCI/100RCI/130RCI/ 150RCI) by host 20, PEs 100, on-chip processor 130 and/or scheduler 150 may be possible.

Figure 6:
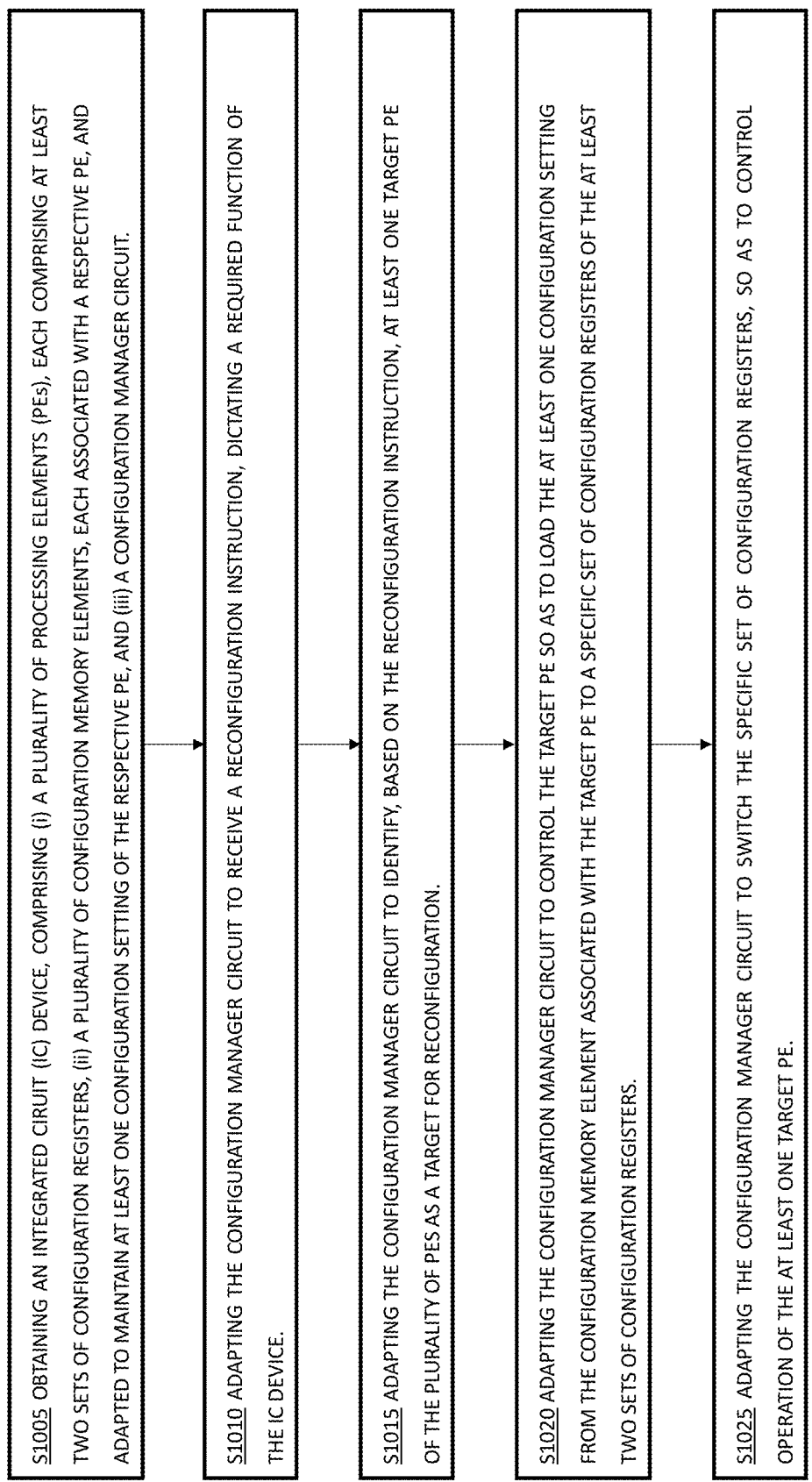
FIG. 6 is a flow diagram describing a method of configuring a reconfigurable IC device, according to some embodiments of the invention.

Reference is now made to FIG. 6, which is a flow diagram describing a method of configuring a reconfigurable IC device 10IC, according to some embodiments of the invention.

As shown in step S1005, embodiments of the invention may obtain an IC device such as IC device 10IC of FIG. 2. As elaborated herein (e.g., in relation to FIG. 2), IC device 10IC may include: (i) A plurality of PEs 100, each having at least two sets of configuration registers 112; (ii) A plurality of configuration memory elements 102, each associated with a respective PE 100, and adapted to maintain at least one configuration setting 104 of the respective PE 100, and (iii) a configuration manager circuit 140.

As shown in step S1010, embodiments of the invention may adapt configuration manager circuit 140 to receive a reconfiguration instruction RCI (e.g., 20RCI/130RCI/150RCI of FIG. 2), dictating a required function of at least a portion of (e.g., one or more PEs 100 of) IC device 10IC.

As shown in step S1015, embodiments of the invention may adapt configuration manager circuit 140 to identify, based on reconfiguration instruction RCI, at least one target PE 100 of the plurality of PEs 100 as a target for reconfiguration.

As shown in step S1020, embodiments of the invention may adapt configuration manager circuit 140 to control the target PE 100 so as to load the at least one configuration setting 104 from the configuration memory element 102 associated with the target PE 100 to a specific set of configuration registers 112 (e.g., [R2-1, . . . , R2-N] of FIG. 3A) of the at least two sets of configuration registers 112.

As shown in step S1025, embodiments of the invention may adapt configuration manager circuit 140 to control the target PE 100 (e.g., control switch 114 of FIG. 3A) so as to switch the specific set of configuration registers (e.g., from [R1-1, . . . , R1-N] to [R2-1, . . . , R2-N] in FIG. 3A). Embodiments of the invention may thereby control operation of the at least one target PE 100 (and subsequently, IC 10IC) according to the required function of IC device 10IC, as dictated by reconfiguration instruction RCI (e.g., 20RCI/130RCI/150RCI).

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. An Integrated Circuit (IC) device comprising:
a plurality of Processing Elements (PEs), each comprising one or more configurable hardware logic blocks;
a plurality of program data memory elements, each associated with a respective PE;
a plurality of configuration memory elements, wherein each configuration memory element is associated with a respective PE, and adapted to maintain two or more configuration settings of that PE, and wherein the two or more configuration settings correspond to two or more respective, consecutive stages in a pipeline of a computational process; and
a configuration manager circuit,
wherein said configuration manager circuit is configured to:
receive a reconfiguration instruction, dictating a required function of at least part of the IC device;
based on the reconfiguration instruction, identify at least one target PE of the plurality of PEs as a target for reconfiguration;
based on the required function, select a specific configuration setting in the configuration memory element associated with the at least one target PE; and
reconfigure at least one hardware logic block of the at least one target PE during run-time, according to the selected configuration setting, while maintaining content of the respective program data memory element, thereby transferring program data between stages of the pipeline.

2. The IC device of claim 1, wherein the one or more hardware logic blocks comprise (i) a computational unit, and (ii) at least one set of configuration registers,
and wherein the configuration manager circuit is further configured to:
calculate a difference between a current configuration setting, and a previous, or default configuration setting of the two or more configuration settings; and
load the calculated difference to a set of configuration registers in a specific hardware logic block of the at least one target PE, thereby reconfiguring operation of the specific hardware logic block of the at least one target PE.

3. The IC device of claim 1, wherein the at least one identified target PE comprises a plurality of target PEs, wherein the one or more hardware logic blocks comprise at least one set of configuration registers, and wherein the configuration manager circuit is further configured to:
halt operation of the plurality of target PEs;
load the selected configuration setting from the configuration memory element of the target PE to specific sets of configuration registers of respective target PEs; and
restart operation of the plurality of target PEs in parallel, allowing the specific sets of configuration registers to control operation of respective target PEs, thereby reconfiguring operation of the plurality of target PEs, substantially simultaneously.

4. The IC device of claim 1, wherein at least one hardware logic block comprises (i) a computational unit, and (ii) at least two sets of configuration registers, and wherein the configuration manager circuit is adapted to reconfigure a target PE by:
loading the selected configuration setting from the configuration memory element of the target PE to a specific set of configuration registers of the at least two sets of configuration registers; and
switching the specific set of configuration registers to control operation of the computational unit of the target PE.

5. The IC device of claim 1, wherein the at least one identified target PE comprises a plurality of target PEs, and wherein the configuration manager circuit is adapted to configure the plurality of target PEs in parallel, substantially simultaneously.

6. The IC device of claim 5, wherein the configuration manager circuit is adapted to:
based on the reconfiguration instruction, produce a plurality of read access requests, wherein each read access request: (i) designates a specific target PE as a recipient, and (ii) includes a reference to the selected configuration setting in the configuration memory element associated with the recipient target PE;
receive, from each PE of the plurality of target PEs, a load-complete indication, representing finalization of loading the configuration setting onto at least one hardware logic block of that PE; and simultaneously switch the plurality of target PEs, such that each operates according to a respective loaded configuration setting, thereby providing the required function, as dictated by the reconfiguration instruction.

7. The IC device of claim 6, wherein each PE comprises at least one configuration bus, concatenating the hardware logic blocks of that PE, and wherein each hardware logic block comprises a set of configuration registers, adapted to control operation of that hardware logic block, and wherein each recipient PE is adapted to:

receive, from the respective configuration memory element, a response to the read access request;

based on the response, produce a configuration data stream comprising one or more entries;

propagate the configuration data stream through the hardware logic blocks via the at least one configuration bus, to load the sets of configuration registers of individual hardware logic blocks; and produce the load-complete indication when the configuration data stream traverses a last hardware logic block of the concatenated hardware logic blocks.

8. The IC device of claim 7, wherein the at least one configuration bus comprises a plurality of configuration buses, each concatenating a unique portion of hardware logic blocks of the recipient PE.

9. The IC device of claim 8, wherein each entry of the configuration data stream comprises (i) an identification of one or more configuration registers in a hardware logic block of the recipient PE, and (ii) configuration data, to be loaded to the identified one or more configuration registers.

10. The method of claim 9, wherein the configuration data comprises a calculated difference between a current configuration setting of the two or more configuration settings, and a previous configuration setting of the two or more configuration settings.

11. The IC device of claim 1, adapted to execute a multi-thread application, wherein each thread of the application comprises a series of hardware-implemented functions.

12. The IC device of claim 1, further comprising a reconfiguration scheduler, adapted to:

employ a plurality of buffer devices, each dedicated to managing execution of a specific hardware-implemented function by one or more threads of the multi-thread application;

monitor congestion of the buffer devices, to identify a required change in a function of at least one hardware logic block; and produce the reconfiguration instruction, based on said identification.

13. The IC device of claim 1, wherein one or more PEs of the plurality of PEs is configured to:

determine a requirement for reconfiguration of one or more other PEs in the IC device; and produce the reconfiguration instruction, based on said determined requirement.

14. A reconfigurable IC device comprising:

a plurality of Processing Elements (PEs), each comprising at least two sets of respective configuration registers;

a plurality of program data memory elements, each associated with a respective PE;

a plurality of configuration memory elements, each associated with a respective PE, and adapted to maintain two or more configuration settings of that PE, wherein the two or more configuration settings correspond to two or more respective, consecutive stages in a pipeline of a computational process; and a configuration manager circuit, wherein said configuration manager circuit is configured to:

receive a reconfiguration instruction, dictating a required function of the IC device;

based on the reconfiguration instruction, identify at least one target PE of the plurality of PEs as a target for reconfiguration;

load the two or more configuration settings from the configuration memory element associated with the target PE to the at least two sets of configuration registers of the target PE; and switch the sets of configuration registers during run time, to control operation of the target PE, while maintaining content of the respective program data memory element, thereby transferring program data between stages of the pipeline.

15. The IC device of claim 14, wherein the at least one identified target PE comprises a plurality of target PEs, and wherein the configuration manager circuit is adapted to configure the plurality of target PEs in parallel, by switching the respective configuration registers substantially simultaneously.

16. The IC device of claim 14, wherein at least one first configuration memory element of the plurality of configuration memory elements is adapted to maintain a plurality of configuration settings of a respective, first target PE, and wherein the configuration manager circuit is further adapted to:

based on the required function, select a specific configuration setting of the plurality of configuration settings in the at least one first configuration memory element;

load the selected, specific configuration setting to a set of configuration registers of the respective, first target PE; and switch the set of configuration registers in the first target PE, to control operation of the first target PE.

17. The IC device of claim 14, wherein at least one second configuration memory element of the plurality of configuration memory elements is adapted to maintain a calculated difference between a current configuration setting of a respective, second target PE and a subsequent configuration setting of the respective, second target PE, and wherein the configuration manager circuit is further adapted to:

based on the required function, load the calculated difference to a set of configuration registers of the respective, second target PE; and switch the set of configuration registers in the second target PE, to control operation of the second target PE.

18. A method of reconfiguring an IC device, the method comprising:

obtaining an IC device, comprising (i) a plurality of Processing Elements (PEs), each comprising at least two sets of configuration registers, (ii) a plurality of configuration memory elements, each associated with a respective PE, and adapted to maintain two or more configuration settings of that PE, and wherein the two or more configuration settings correspond to two or more respective, consecutive stages in a pipeline of a computational process, (iii) a plurality of program data memory elements, each associated with a respective PE, and (iv) a configuration manager circuit; and adapting the configuration manager circuit to:

receive a reconfiguration instruction, dictating a required function of the IC device;

based on the reconfiguration instruction, identify at least one target PE of the plurality of PEs as a target for reconfiguration;

load the two or more configuration settings from the configuration memory element associated with the target PE to the at least two sets of configuration registers of the target PE; and switch the sets of configuration registers during run time, to control operation of the at least one target PE, while maintaining content of the respective program data memory element, thereby transferring program data between stages of the pipeline.

19. The method of claim 18, wherein one or more configuration memory elements of the plurality of configuration memory elements are adapted to maintain a plurality of configuration settings of the respective PE, and wherein the method further comprises adapting the configuration manager circuit to:

based on the required function, selecting a specific configuration setting of the plurality of configuration settings, in a configuration memory element associated with the at least one target PE; and loading the selected configuration setting to at least two sets of configuration registers the at least one target PE, thereby reconfiguring the at least one target PE.

20. The method of claim 18, wherein the at least one identified target PE comprises a plurality of target PEs, and wherein the method further comprises adapting the configuration manager circuit to:

based on the reconfiguration instruction, produce a plurality of read access requests, wherein each read access request: (i) designates a specific target PE as a recipient, and (ii) includes a reference to the selected configuration setting in the configuration memory element associated with the recipient target PE;

receive, from each PE of the plurality of target PEs, a load-complete indication, representing finalization of loading the configuration setting onto at least one hardware logic block of that PE; and simultaneously switch the plurality of target PEs, such that each target PE operates according to a respective loaded configuration setting, thereby providing the required function, as dictated by the reconfiguration instruction.

* * * * *